(12) United States Patent
Matsumoto et al.

(10) Patent No.: US 6,451,690 B1
(45) Date of Patent: Sep. 17, 2002

(54) METHOD OF FORMING ELECTRODE STRUCTURE AND METHOD OF FABRICATING SEMICONDUCTOR DEVICE

(75) Inventors: Michikazu Matsumoto, Kyoto; Naohisa Sengoku, Osaka, both of (JP)

(73) Assignee: Matsushita Electronics Corporation (JP)

( * ) Notice: Subject to any disclaimer, the term of this patent is extended or adjusted under 35 U.S.C. 154(b) by 19 days.

(21) Appl. No.: 09/679,617

(22) Filed: Oct. 5, 2000

(30) Foreign Application Priority Data

Mar. 13, 2000 (JP) ......................... 2000-068337

(51) Int. Cl.[7] .............................................. H01L 21/44
(52) U.S. Cl. .................. 438/653; 438/625; 438/627; 438/643; 438/648; 438/656; 438/688
(58) Field of Search ................. 438/625, 627, 438/643, 648, 653, 656, 688

(56) References Cited

U.S. PATENT DOCUMENTS 5,565,708 A * 10/1996 Ohsaki et al. ............... 257/764
5,972,178 A * 10/1999 Narasimhan et al. .. 204/192.17
6,156,647 A * 12/2000 Hogan ........................ 438/653
6,174,798 B1 * 1/2001 Hsia et al. .................. 438/625
6,271,592 B1 * 8/2001 Kim et al. ................... 257/751

FOREIGN PATENT DOCUMENTS

JP          07-235542          9/1995

* cited by examiner

*Primary Examiner*—Carl Whitehead, Jr.
*Assistant Examiner*—Khanh B. Duong
(74) *Attorney, Agent, or Firm*—Nixon Peabody LLP; Donald R. Studebaker

(57) ABSTRACT

After forming a barrier film on a silicon-containing film including silicon as a main component, a high-melting-point metal film is deposited on the barrier film, so as to form a laminated structure including the silicon-containing film, the barrier film and the high-melting-point metal film. The laminated structure is subjected to a heat treatment at a temperature of 750° C. or more. The barrier film is formed by forming a first metal film of a nitride of a metal on the silicon-containing film; forming, on the first metal film, a second metal film of the metal or the nitride of the metal with a smaller nitrogen content than the first metal film; and forming, on the second metal film, a third metal film of the nitride of the metal with a larger nitrogen content than the second metal film.

8 Claims, 15 Drawing Sheets

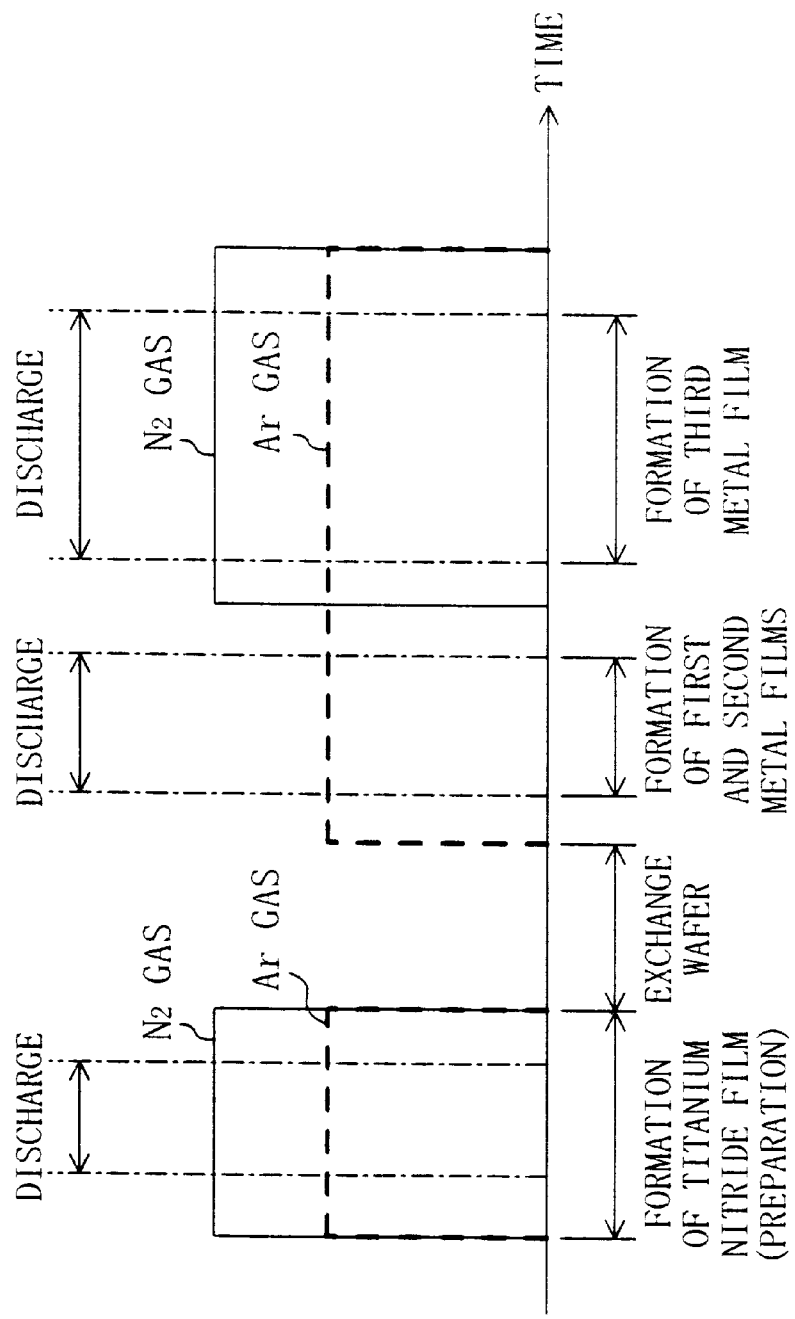

METHOD OF FORMING ELECTRODE STRUCTURE AND METHOD OF FABRICATING SEMICONDUCTOR DEVICE

BACKGROUND OF THE INVENTION

The present invention relates to a method of forming an electrode structure including a lower layer of polysilicon or amorphous silicon and an upper layer of a high-melting-point metal, and a method of fabricating a semiconductor device including a gate electrode formed from the electrode structure.

In a conventional MOS transistor, a gate electrode is formed from a polysilicon film. In accordance with improvement of LSIs in refinement and high speed operation, there are increasing demands for lowering the resistance of the gate electrode of a MOS transistor.

Therefore, as technique to lower the resistance of the gate electrode, a polymetal gate electrode having a laminated structure including a lower polysilicon film and an upper high-melting-point metal film has been proposed to be used as the gate electrode, and a tungsten film has been proposed as the upper high-melting-point metal film. By using a tungsten film as the upper high-melting-point metal film, the resistance value of the gate electrode can be lowered.

It is necessary to form a barrier film of tungsten nitride ($WN_x$) or titanium nitride (TiN) between a polysilicon film and a tungsten film in order to prevent an impurity (such as B, P and As) introduced into the polysilicon film from diffusing into the tungsten film (as disclosed in, for example, Japanese Laid-Open Patent Publication No. 11-261059 or 7-235542).

FIG. 12(a) is a sectional view of an electrode structure of a first conventional example. As is shown in FIG. 12(a), a gate electrode is formed on a semiconductor substrate 1 with a gate insulating film 2 sandwiched therebetween, and the gate electrode includes a polysilicon film 3, a barrier film 4A of tungsten nitride ($WN_x$) and a tungsten film 5 successively formed upward.

FIG. 12(b) is a sectional view of an electrode structure of a second conventional example. As is shown in FIG. 12(b), a gate electrode is formed on a semiconductor substrate 1 with a gate insulating film 2 sandwiched therebetween, and the gate electrode includes a polysilicon film 3, a barrier film 4B of titanium nitride (TiN) and a tungsten film 5 successively formed upward.

In the electrode structure of the first conventional example, a heat treatment conducted in a later procedure evaporates nitrogen included in the barrier film 4A of tungsten nitride, so that the barrier film 4A can be changed into the tungsten film 5. In addition, nitrogen included in the barrier film 4A reacts with silicon included in the polysilicon film 3, so that a reaction layer 6 of silicon nitride (SiN) having a very large resistance value can be formed between the polysilicon film 3 and the tungsten film 5 as is shown in FIG. 12(c). As a result, the resistance value of the gate electrode is disadvantageously increased.

Therefore, Japanese Laid-Open Patent Publication No. 7-235542 describes that the sheet resistance of the reaction layer 6 can be reduced to lower the resistance value of the gate electrode by setting the surface density of nitrogen included in the reaction layer 6 of silicon nitride to a predetermined value or less.

The present inventors have found, however, that the resistance value of the gate electrode cannot be lowered even by setting the surface density of nitrogen included in the reaction layer 6 to the predetermined value or less in the electrode structure of the first conventional example.

Therefore, the reason why the resistance value of the gate electrode cannot be lowered in the first example has variously examined to find the following: When the thickness of the barrier film 4A is reduced to approximately 0.1 through 1.0 nm in order to reduce the surface density of nitrogen included in the reaction layer 6, the barrier film 4A cannot exhibit the barrier function. Accordingly, tungsten silicide ($WSi_x$) is formed, so that the resistance value of the gate electrode cannot be lowered. When the thickness of the barrier film 4A is increased to exceed 1.0 nm, although the barrier film 4A can exhibit the barrier function, the reaction layer 6 of silicon nitride having a very large resistance value is formed between the polysilicon film 3 and the tungsten film 5. Accordingly, the interface resistance value between the polysilicon film 3 and the tungsten film 5 is increased.

As another problem, since a tungsten nitride film is poor at heat resistance, a great deal of nitrogen included in the tungsten nitride film can be diffused through a heat treatment conducted at a temperature of 750° C. or more, so that the tungsten nitride film can be changed into a tungsten film.

In the case where a barrier film of titanium nitride is used as in the second conventional method, the interface resistance value between the polysilicon film 3 and the tungsten film 5 is increased owing to the reaction layer 6 of silicon nitride having a very large resistance value formed between the polysilicon film and the tungsten film for the reason described below.

First, as is shown in FIG. 13(a), a polysilicon film 3 is formed on a semiconductor substrate 1 with a gate insulating film 2 sandwiched therebetween. The polysilicon film 3 is doped with a p-type impurity such as boron when a p-type gate electrode is to be formed, and is doped with an n-type impurity such as phosphorus when an n-type gate electrode is to be formed. Next, in order to deposit a titanium nitride film 4B on the polysilicon film 3, the semiconductor substrate 1 is loaded within a chamber where a titanium target 7 including titanium as a main component is placed, and a mixed gas including argon and nitrogen is introduced into the chamber and discharge is caused within the chamber. In this manner, plasma of the argon gas and the nitrogen gas is generated, so that a reaction layer 6 of silicon nitride can be formed in a surface portion of polysilicon film 3 through a reaction between nitrogen ions of the plasma and silicon of the polysilicon film 3. Furthermore, the titanium target 7 is nitrided so as to form a titanium nitride film 8 thereon, and titanium nitride is sputtered out from the titanium nitride film 8. As a result, the barrier film 4B of titanium nitride is formed on the reaction layer 6 as is shown in FIG. 13(b).

Then, the semiconductor substrate 1 is transferred to a chamber where a tungsten target 9 including tungsten as a main component is placed, and an argon gas is introduced into the chamber and discharge is caused within the chamber. In this manner, plasma of the argon gas is generated, so that tungsten can be sputtered out from the tungsten target 9 through sputtering of argon ions included in the plasma. The sputtered tungsten is deposited on the surface of the titanium nitride film 4B, and thus, a tungsten film 5 is formed on the titanium nitride film 4B as is shown in FIG. 13(c).

Next, an impurity layer to be formed into a source or drain of a MOS transistor is formed in the semiconductor substrate 1, and a heat treatment is carried out for activating the impurity layer at a temperature of, for example, 750° C. or more. In this manner, as is shown in FIG. 14(a), excessive nitrogen included in the barrier film 4B is diffused into an upper portion of the polysilicon film 3. As a result, the reaction layer 6 of titanium nitride is increased in its thickness as is shown in FIG. 14(*b*).

Moreover, the present inventors have examined the relationship between the temperature of the heat treatment and the interface resistance of the barrier film after the heat treatment. FIG. 15 shows the relationship between the temperature (°C.) of the heat treatment and the interface resistance ($R_c$) between the polysilicon film and the high-melting-point metal film after the heat treatment. In FIG. 15, a symbol ● indicates the result obtained when a barrier film of tungsten nitride ($WN_x$) is formed on an n-type polysilicon film (indicated as NPS); a symbol ○ indicates the result obtained when a barrier film of tungsten nitride is formed on a p-type polysilicon film (indicated as PPS); a symbol ♦ indicates the result obtained when a barrier film of titanium nitride (TiN) is formed on an n-type polysilicon film; and a symbol ◇ indicates the result obtained when a barrier film of titanium nitride is formed on a p-type polysilicon film. Furthermore, the resistance shown in FIG. 15 is not ohmic resistance, and hence, a resistance value obtained by allowing a current of 1 mA/$\mu$m$^2$ to flow is shown as interface resistance.

It is understood from FIG. 15 that in using the barrier film 4B of titanium nitride, the interface resistance is high even when the heat treatment is conducted at a low temperature. Furthermore, the present inventors have found through experiments that in using the barrier film 4B of titanium nitride, the interface resistance is high even when the heat treatment is not conducted. This is because the reaction layer 6 of titanium nitride is formed between the polysilicon film 3 and the barrier film 4B as is shown in FIGS. 13(*a*) through 13(*c*).

Also, when the barrier film 4A of tungsten nitride is used, although the interface resistance is lower than in using the barrier film 4B of titanium nitride, the interface resistance is abruptly increased through a heat treatment conducted at 750° C. or more. This is because nitrogen included in tungsten nitride of the barrier film 4A is diffused through the heat treatment conducted at 750° C. or more, so as to form the reaction layer 6 of silicon nitride between the polysilicon film 3 and the tungsten film 5.

As the interface resistance ($R_c$) between the polysilicon film 3 and the tungsten film 5 is increased, the operation speed of the MOS transistor is lowered. Specifically, when the gate electrode is AC operated, distributed capacity generated in the gate insulating film is repeatedly charged and discharged. Therefore, a current flows through the distributed interface resistance, so that the distributed interface resistance can affect to lower the operation speed of the MOS transistor. When the operation speed of the MOS transistor is lowered, the operation speed of an LSI including the MOS transistor is lowered, which causes a problem that signal delay time is increased. Since the operation speed of an LSI is regarded the most significant these days, degradation in the operation speed of the MOS transistor by merely several % can cause a serious problem.

SUMMARY OF THE INVENTION

In consideration of the aforementioned conventional problems, an object of the invention is lowering interface resistance between a polysilicon film and a high-melting-point metal film.

In order to achieve the object, the method of forming an electrode structure of this invention comprises the steps of forming a barrier film on a silicon-containing film including silicon as a main component; depositing a high-melting-point metal film on the barrier film, whereby forming a laminated structure including the silicon-containing film, the barrier film and the high-melting-point metal film; and conducting a heat treatment on the laminated structure at a temperature of 750° C. or more, and the step of forming the barrier film includes sub-steps of forming a first metal film of a nitride of a metal on the silicon-containing film; forming, on the first metal film, a second metal film of the metal or the nitride of the metal with a smaller nitrogen content than the first metal film; and forming, on the second metal film, a third metal film of the nitride of the metal with a larger nitrogen content than the second metal film.

In the method of forming an electrode structure of this invention, after conducting the heat treatment, part of nitrogen included in the first metal film and part of nitrogen included in the third metal film is consumed in nitriding of the second metal film, and merely little of the nitrogen included in the first metal film is concerned with nitriding of the silicon-containing film. Accordingly, a reaction layer of a silicon nitride film having a very large resistance value is not formed on the interface between the silicon-containing film and the barrier film, or if the reaction layer is formed, the thickness is small. Accordingly, the interface resistance between the silicon-containing film and the high-melting-point metal film is lowered.

In the method of forming an electrode structure of this invention, the metal is preferably titanium.

In the method of forming an electrode structure, the step of forming the barrier film preferably includes sub-steps of forming the first metal film by depositing the nitride of the metal on the silicon-containing film through sputtering using an inert gas substantially including no nitrogen gas conducted on a nitride film of the metal formed in a surface portion of a target including the metal as a main component, and forming the second metal film by depositing the metal on the first metal film; and conducting sputtering using a mixed gas including a nitrogen gas and an inert gas on the target, whereby the third metal film is formed by depositing, on the second metal film, the nitride of the metal obtained through a reaction of the metal and nitrogen included in the mixed gas.

In this manner, the sputtering using an inert gas substantially including no nitrogen gas is conducted for forming the first metal film. Therefore, a silicon nitride film can be prevented from being formed in a surface portion of the silicon-containing film, and hence, the interface resistance between the silicon-containing film and the high-melting-point metal film is further lowered. Furthermore, the first metal film, the second metal film and the third metal film can be continuously formed by using the same target by merely changing the kind of gas to be used for the sputtering, resulting in improving the throughput.

In this case, the method preferably further comprises, after the step of forming the barrier film, a step of conducting sputtering using an inert gas substantially including no nitrogen gas on the nitride film of the metal formed in the surface portion of the target formed in the sub-step of forming the third metal film.

When the method thus includes the step of conducting sputtering the metal nitride film formed in the surface portion of the target during the formation of the third metal film by using an inert gas substantially including no nitrogen gas, the concentration of nitrogen in the metal nitride film is reduced. Therefore, the nitrogen concentration in the first metal film formed by using the metal nitride film is reduced, resulting in further reducing the nitrogen concerned with the nitriding of the silicon-containing film. Accordingly, the reaction layer of a silicon nitride film is more difficult to form on the interface between the silicon-containing film and the barrier film, or if it is formed, the thickness is further smaller. As a result, the interface resistance between the silicon-containing film and the high-melting-point metal film can be further lowered.

In the method of forming an electrode structure, the step of forming the barrier film includes preferably sub-steps of introducing an inert gas substantially including no nitrogen gas into a chamber where a target including the metal as a main component and having a nitride film of the metal in a surface portion thereof is placed and causing discharge within the chamber, whereby the first metal film is formed by depositing, on the silicon-containing film, the nitride of the metal sputtered out from the nitride film of the metal, and forming the second metal film by depositing the metal on the first metal film; and introducing a mixed gas including a nitrogen gas and an inert gas into the chamber where the target is placed and causing discharge within the chamber, whereby the third metal film is formed by depositing, on the second metal film, the nitride of the metal obtained through a reaction between the metal and nitrogen included in the mixed gas.

In this manner, an inert gas substantially including no nitrogen gas is introduced into the chamber for forming the first metal film, and hence, a silicon nitride film is not formed in the surface portion of the silicon-containing film. Accordingly, the interface resistance between the silicon-containing film and the high-melting-point metal film can be further lowered. Also, the first metal film, the second metal film and the third metal film can be continuously formed by using the same target placed in the same chamber by merely changing the kind of gas to be used for the sputtering, resulting in improving the throughput.

In this case, the method preferably further comprises, after the step of forming the barrier film, a step of introducing an inert gas substantially including no nitrogen gas into the chamber and causing discharge within the chamber.

When the method thus includes, after the step of forming the barrier film, the step of introducing an inert gas substantially including no nitrogen gas into the chamber and causing discharge within the chamber, the metal nitride film formed in the surface portion of the target during the formation of the third metal film can be sputtered by using the inert gas substantially including no nitrogen gas. Accordingly, since the concentration of nitrogen in the metal nitride film is reduced, the nitrogen concentration in the first metal film formed by using the metal nitride film can be reduced, and hence, further less nitrogen is concerned with the nitriding of the silicon-containing film. As a result, the reaction layer of a silicon nitride film is more difficult to form on the interface between the silicon-containing film and the barrier film, or if the reaction layer is formed, the thickness can be further smaller. Therefore, the interface resistance between the silicon-containing film and the high-melting-point metal film can be further lowered.

The method of fabricating a semiconductor device of this invention comprises the steps of forming a polysilicon film on a semiconductor region; forming a barrier film on the polysilicon film; depositing a high-melting-point metal film on the barrier film, whereby forming a gate electrode including the silicon-containing film, the barrier film and the high-melting-point film; forming an impurity layer serving as a source or drain through ion implantation of an impurity into the semiconductor region with the gate electrode used as a mask; and activating the impurity layer by conducting a heat treatment at a temperature of 750° C. or more, and the step of forming the barrier film includes sub-steps of forming a first metal film of a nitride of a metal on the silicon-containing film; forming, on the first metal film, a second metal film of the metal or the nitride of the metal with a smaller nitrogen content than the first metal film; and forming, on the second metal film, a third metal film of the nitride of the metal with a larger nitrogen content than the second metal film.

In the present method of fabricating a semiconductor device, a semiconductor device is fabricated by using the method of forming an electrode structure of this invention. Therefore, even when the heat treatment is carried out at 750° C. or more for activating the impurity layer serving as a source or drain, the interface resistance between the polysilicon film and the high-melting-point metal film in the gate electrode can be low. As a result, the delay time of the MOS transistor can be reduced, resulting in improving the operation speed of the MOS transistor.

In the method of fabricating a semiconductor device of this invention, the metal is preferably titanium.

BRIEF DESCRIPTION OF THE DRAWINGS

FIG. 3 is a sequence diagram for showing the relationship between the kind of gas to be introduced into a chamber and discharge in Embodiment 1;

DETAILED DESCRIPTION OF THE INVENTION

EMBODIMENT 1

As a method of forming an electrode structure according to Embodiment 1 of the invention, formation of a gate electrode will now be described with reference to FIGS. 1(a) through 1(c), 2(a) through 2(c) and 3.

Figure 1A:
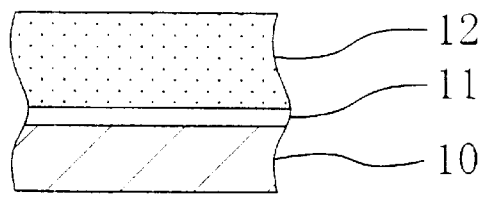
FIGS. 1(a), 1(b) and 1(c) are cross-sectional views for showing procedures in a method of forming an electrode structure according to Embodiment 1 of the invention.

First, as is shown in FIG. 1(a), a gate insulating film 11 of a silicon oxide film is formed on a silicon substrate 10, and an amorphous silicon film is deposited on the gate insulating film 11 by low pressure CVD.

Next, an n-type gate electrode formation region of the amorphous silicon film is doped with phosphorus (P) ions at an implantation energy of 10 KeV and a dose of $8\times10^{15}$ cm$^{-2}$, and a p-type gate electrode formation region of the amorphous silicon film is doped with boron (B) ions at an implantation energy of 5 KeV and a dose of $5\times10^{15}$ cm$^{-2}$. Then, the amorphous silicon film doped with the phosphorus ions or the boron ions is subjected to a heat treatment at a temperature of 800° C. for 30 seconds, thereby crystallizing the amorphous silicon film into an n-type or p-type polysilicon film 12. Thereafter, a silicon oxide film formed on the polysilicon film 12 is removed with a hydrofluoric acid cleaner.

Next, as a preparation process, as is shown in FIG. 3, a mixed gas including an argon gas and a nitrogen gas is introduced into a chamber where a titanium target including titanium as a main component is placed and discharge is caused within the chamber, so as to form a titanium nitride film in a surface portion of the titanium target.

Figure 1B:
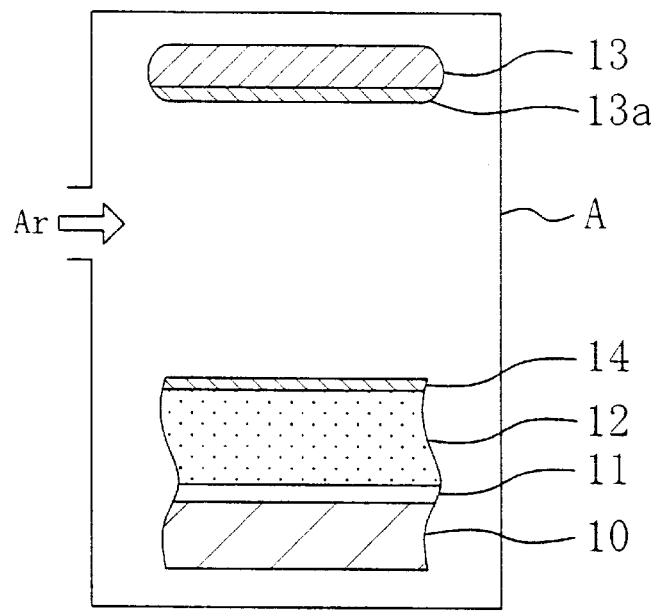

Then, as a wafer exchange process, a semiconductor substrate (wafer) used in the preparation process is taken out, and the semiconductor substrate 10 is loaded in the chamber A where the titanium target 13 including the titanium nitride film 13a in the surface portion is placed as is shown in FIG. 1(b).

Next, as is shown in FIG. 3, an argon gas is introduced into the chamber A and discharge is caused within the chamber A. In this manner, plasma of the argon gas is generated, so that argon ions included in the plasma can sputter the titanium nitride film 13a in the surface portion of the titanium target 13. Therefore, as is shown in FIG. 1(b), a first titanium nitride film 14 serving as a first metal film is deposited on the polysilicon film 12. During this, the titanium nitride film 13a having been formed in the surface portion of the titanium target 13 disappears.

Figure 1C:
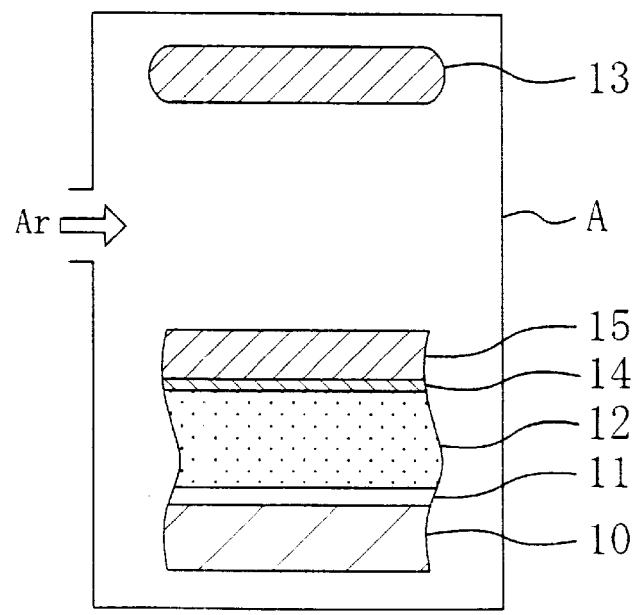

When the introduction of the argon gas into the chamber A and discharge within the chamber A are further continued, the argon ions included in the plasma sputter the titanium target 13, so as to deposit a titanium film 15 serving as a second metal film on the first titanium nitride film 14 as is shown in FIG. 1(c).

Next, as is shown in FIG. 3, after the discharge is once stopped, a mixed gas including an argon gas and a nitrogen gas is introduced into the chamber A and discharge is caused again. Thus, a second titanium nitride film 16 serving as a third metal film is formed in a surface portion of the titanium film 15 and the titanium nitride film 13a is also formed in a surface portion of the titanium target 13.

According to Embodiment 1, by introducing an argon gas into the chamber A where the titanium target 13 having the titanium nitride film 13a in the surface portion is placed, the titanium nitride film 14 serving as the first metal film and the titanium film 15 serving as the second metal film can be continuously deposited. In addition, by introducing the mixed gas of argon and nitrogen into the chamber A thereafter, the titanium nitride film 16 serving as the third metal film can be formed on the titanium film 15. In other words, the first titanium nitride film 14, the titanium film 15 and the second titanium nitride film 16 can be continuously formed by merely changing the kind of gas to be introduced into the chamber A without exchanging the titanium target 13, resulting in improving the throughput.

The titanium nitride film 13a formed in the surface portion of the titanium target 13 during formation of the second titanium nitride film 16 can be used in depositing the first titanium nitride film 14 on the polysilicon film 12. In other words, the formation of the third metal film and the preparation process can be conducted in one and the same procedure. Thus, the throughput is further improved.

Figure 2A:
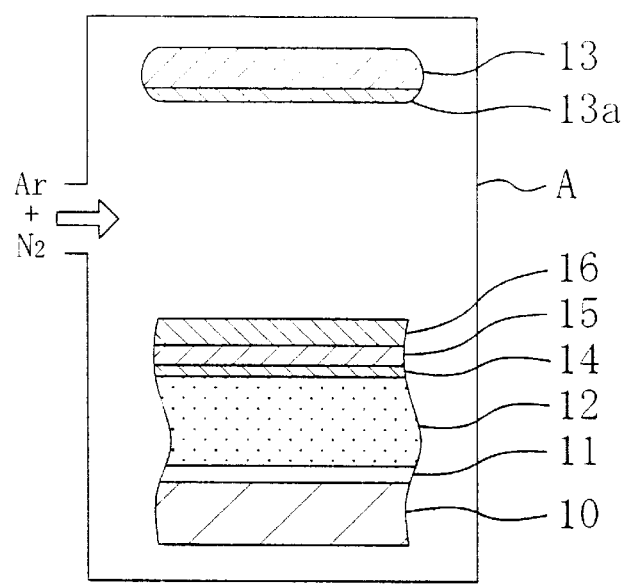
FIGS. 2(a), 2(b) and 2(c) are cross-sectional views for showing other procedures in the method of forming an electrode structure of Embodiment 1.
Figure 2B:
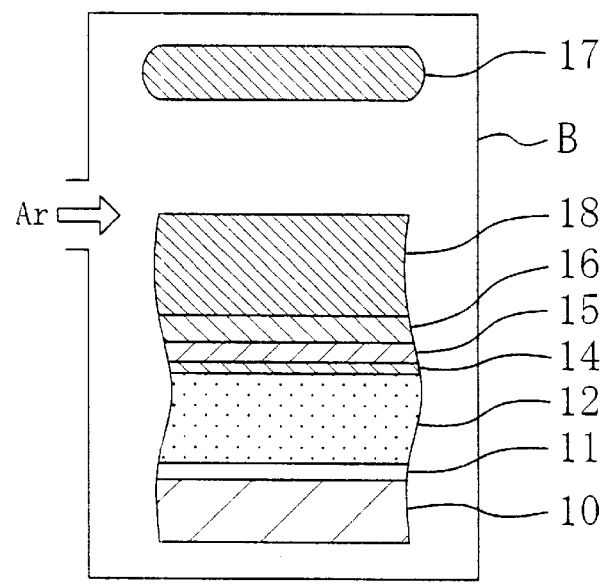

Next, as is shown in FIG. 2(b), the semiconductor substrate 10 is transferred to a chamber B where a tungsten target 17 including tungsten as a main component is placed, and an argon gas is introduced into the chamber B and discharge is caused within the chamber B. In this manner, plasma of the argon gas is generated, so that argon ions included in the plasma can sputter the tungsten target 17. Therefore, a tungsten film 18 serving as a high-melting-point metal film is deposited on the second titanium nitride film 16. The polysilicon film 12, the first titanium nitride film 14, the titanium film 15, the second titanium nitride film 16 and the tungsten film 18 together form a gate electrode formed from the electrode structure of this embodiment. Also, the first titanium nitride film 14, the titanium film 15 and the second titanium nitride film 16 together form a barrier film. The barrier film preferably has a thickness of approximately 5 nm through 20 nm so as to prevent the gate electrode from having a too large thickness.

Subsequently, although not shown in the drawings, the semiconductor substrate 10 is doped with an impurity by using the gate electrode as a mask, so as to form an impurity layer serving as a source or drain. Then, a heat treatment is carried out at, for example, 750° C. or more for activating the impurity.

Since the first titanium nitride film 14 is disposed between the polysilicon film 12 and the titanium film 15, titanium silicide (TiSi$_2$) having a large resistance value can be prevented from being formed in a surface portion of the polysilicon film 12 through the heat treatment at 750° C. or more.

Figure 2C:
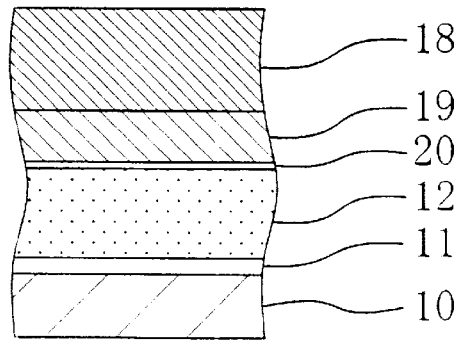

Also, nitrogen present in the first titanium nitride film 14 is diffused into the titanium film 15 and the polysilicon film 12 through the heat treatment at 750° C. or more. At this point, excessive nitrogen included in the first titanium nitride film 14 and the second titanium nitride film 16 is diffused into the titanium film 15, so as to change the titanium film 15 into a titanium nitride film. Accordingly, a new titanium nitride film 19 is formed as is shown in FIG. 2(c). Furthermore, since nitrogen present in the first titanium nitride film 14 is diffused into the polysilicon film 12, a reaction layer 20 including silicon and nitrogen as main components is formed on an interface between the polysilicon film 12 and the titanium nitride film 19.

As described above, the reaction layer 20 including silicon and nitrogen as main components has a very large resistance value, and hence, when it has a large thickness, the interface resistance between the polysilicon film 12 and the tungsten film 18 is large.

In Embodiment 1, however, owing to the titanium film 15 formed on the first titanium nitride film 14, nitrogen included in the first titanium nitride film 15 is consumed in nitriding the titanium film 15 and merely little nitrogen is concerned with nitriding of the polysilicon film 12. Therefore, the reaction layer 20 has a thickness much smaller than that formed in the conventional method.

Furthermore, although nitrogen included in the second titanium nitride film 16 is also diffused during the heat treatment, owing to the titanium film 15 formed below the second titanium nitride film 16, nitrogen included in the second titanium nitride film 16 is consumed in nitriding of the titanium film 15 and does not reach the polysilicon film 12. Accordingly, a reaction layer derived from the nitrogen included in the second titanium nitride film 16 is not formed.

Accordingly, the interface resistance between the polysilicon film 12 and the tungsten film 18 can be largely lowered in Embodiment 1.

The thickness of the first titanium nitride film 14 is preferably 3 nm or less and most preferably approximately 2 nm. This is because when the thickness of the first titanium nitride film 14 exceeds 3 nm, the thickness of the reaction layer 20 formed through the heat treatment at 750° C. or more is so large that the interface resistance between the polysilicon film 12 and the tungsten film 18 can be increased.

Figure 4A:
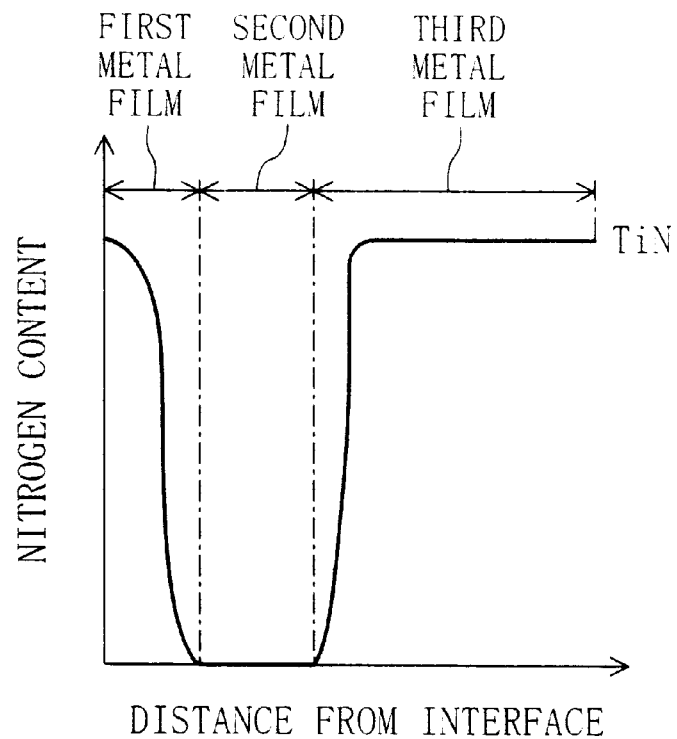
FIGS. 4(a) and 4(b) are diagrams for showing the relationship between a distance from the interface and a nitrogen content in a barrier film formed in Embodiment 1.
Figure 4B:
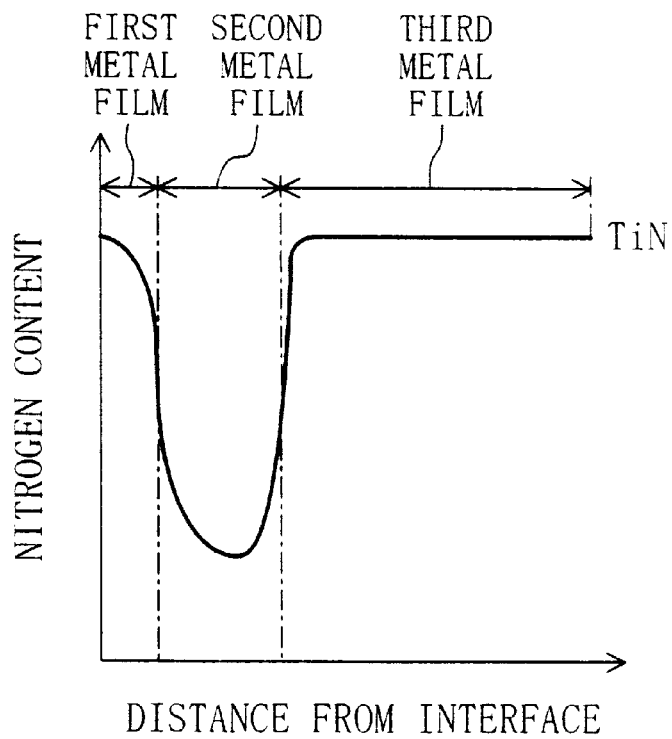

FIGS. 4(a) and 4(b) show distribution of the nitrogen content in the first titanium nitride film 14, the titanium film 15 and the second titanium nitride film 16 together forming the barrier film, in which the abscissa indicates a distance from the interface between the barrier film and the polysilicon film toward the substrate.

In the nitrogen content distribution of FIG. 4(a), nitrogen is present as TiN on the interface between the first metal film (first titanium nitride film 14) and the polysilicon film, and the nitrogen content is gradually reduced toward the substrate and is 0 (zero) on the interface between the first metal film and the second metal film (titanium film 15). Also, the nitrogen content is 0 on the interface between the second metal film and the third metal film (second titanium nitride film 16), and the nitrogen content is gradually increased toward the substrate, so that nitrogen can be ultimately present as TiN.

In the nitrogen content distribution of FIG. 4(b) nitrogen is present as TiN on the interface between the first metal film (first titanium nitride film 14) and the polysilicon film, and the nitrogen content is gradually reduced toward the substrate and is a half of the content in TiN on the interface between the first metal film and the second metal film (titanium film 15), and the nitrogen content becomes very small around the center in the depth direction of the second metal film. Also, the nitrogen content is approximately a half of that in TiN on the interface between the second metal film and the third metal film (second titanium nitride film 16) and is gradually increased toward the substrate, so that nitrogen can be ultimately present as TiN.

In order to realize the nitrogen content distribution as shown in FIG. 4(b), time for introducing the argon gas for forming the titanium film 15 is reduced or the power of discharge is lowered.

Since the first titanium nitride film 14, the titanium film 15 and the second titanium nitride film 16 are continuously formed by using the titanium target 13 having the titanium nitride film 13a in the surface portion in Embodiment 1, the nitrogen content is gradually reduced and gradually increased. When a target including titanium nitride as a main component and a target including titanium as a main component are separately used, the nitrogen content is not continuously varied but abruptly varied between the first or second titanium nitride film 14 or 16 and the titanium film 15.

EMBODIMENT 2

As a method of forming an electrode structure according to Embodiment 2 of the invention, formation of a gate electrode will now be described with reference to FIGS. 1(a) through 1(c), 5(a) through 5(c) and 6.

In the same manner as in Embodiment 1, a gate insulating film 11 is formed on a silicon substrate 10 and a polysilicon film 12 is deposited on the gate insulating film 11 as is shown in FIG. 1(a).

Figure 6:
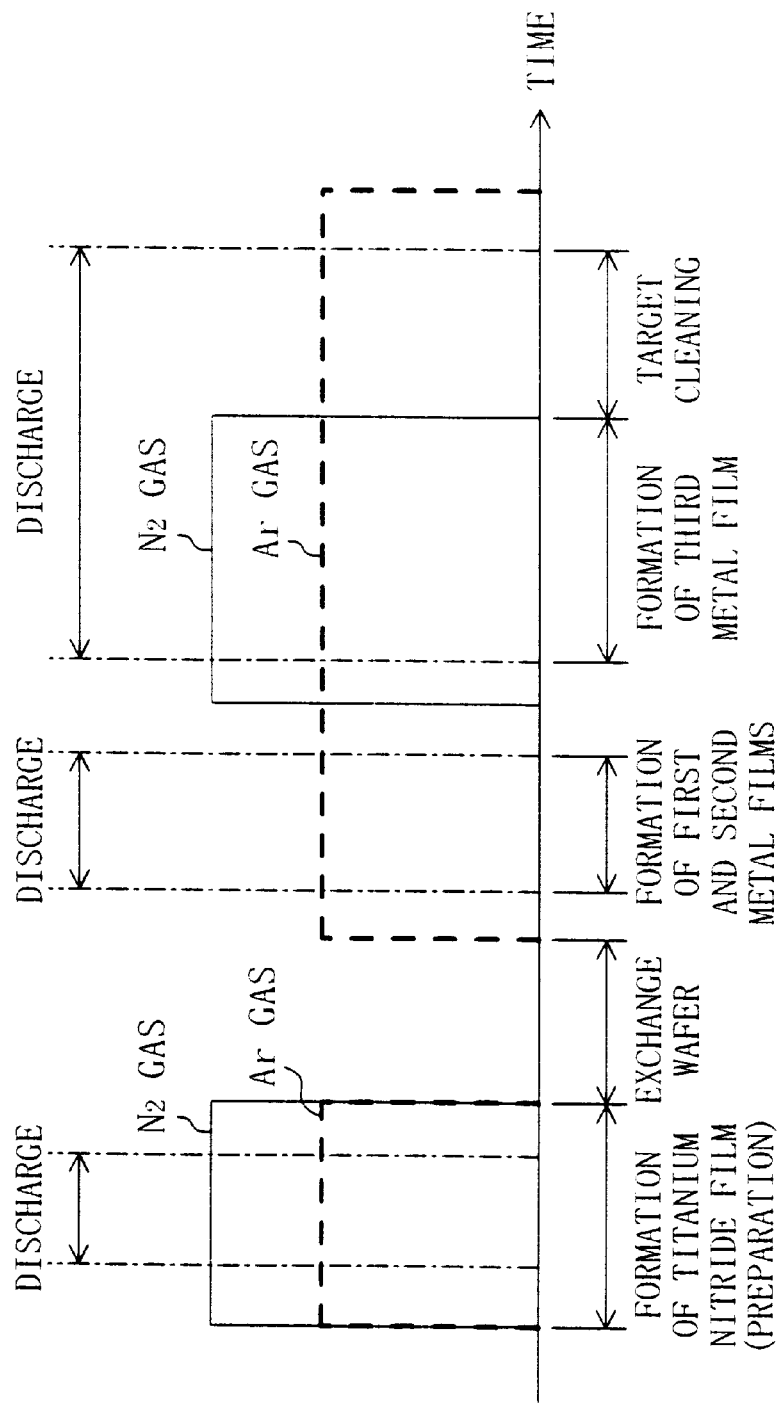
FIG. 6 is a sequence diagram for showing the relationship between the kind of gas to be introduced into a chamber and discharge in Embodiment 2.

Next, as a preparation process, as is shown in FIG. 6, a mixed gas including an argon gas and a nitrogen gas is introduced into a chamber where a titanium target including titanium as a main component is placed and discharge is caused within the chamber, so as to form a titanium nitride film in a surface portion of the titanium target.

Then, the semiconductor substrate 10 is loaded within the chamber A where the titanium target 13 having the titanium nitride film 13a in the surface portion is placed. In the same manner as in Embodiment 1, a titanium nitride film 14 serving as a first metal film is formed on the polysilicon film 12 as is shown in FIG. 1(b), and a titanium film 15 is formed on the first titanium nitride film 14 as is shown in FIG. 1(c).

Figure 5A:
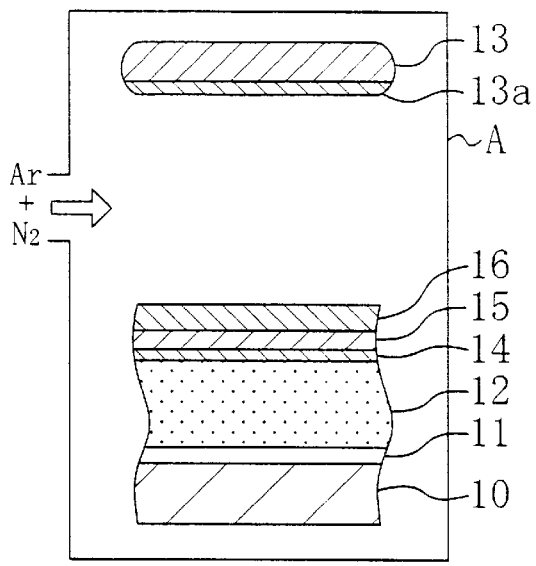
FIGS. 5(a), 5(b) and 5(c) are cross-sectional views for showing procedures in a method of forming an electrode structure according to Embodiment 2 of the invention.

Next, as is shown in FIG. 6, the discharge is once stopped, a mixed gas including an argon gas and a nitrogen gas is introduced into the chamber A and the discharge is caused again. Thus, a second titanium nitride film 16 serving as a third metal film is formed in a surface portion of the titanium film 15, and the titanium nitride film 13a is also formed in a surface portion of the titanium target 13 as is shown in FIG. 5(a).

Figure 5B:
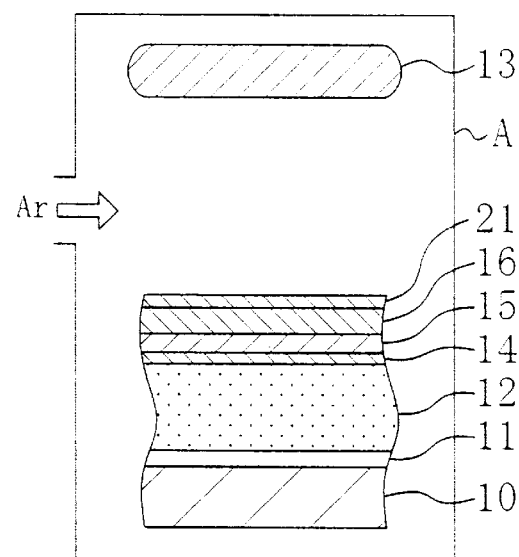

Then, as is shown in FIG. 6, a target cleaning process is carried out by introducing an argon gas alone into the chamber A and continuously causing the discharge within the chamber A. In this manner, the titanium nitride film 13a in the surface portion of the titanium target 13 is sputtered by argon ions, and hence, the nitrogen content in the titanium nitride film 13a is reduced, and a third titanium nitride film 21 is deposited on the second titanium nitride film 16 as is shown in FIG. 5(b).

Figure 5C:
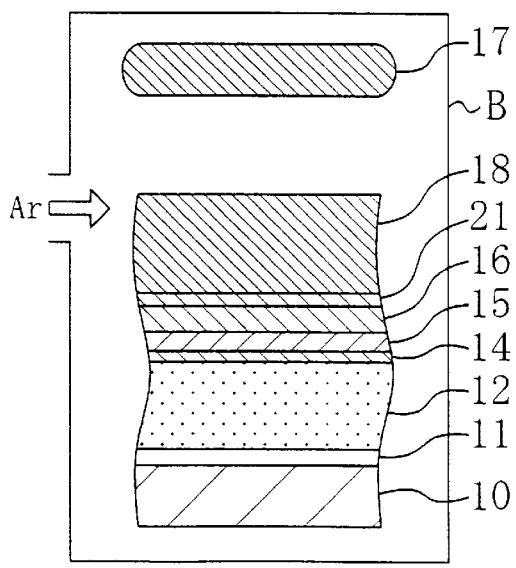

Next, as is shown in FIG. 5(c), the semiconductor substrate 10 is transferred to a chamber B where a tungsten target 17 including tungsten as a main component is placed, an argon gas is introduced into the chamber B and discharge is caused within the chamber B. Thus, a tungsten film 18 serving as a high-melting-point metal film is deposited on the third titanium nitride film 21. The polysilicon film 12, the first titanium nitride film 14, the titanium film 15, the second titanium nitride film 16, the third titanium nitride film 21 and the tungsten film 18 together form a gate electrode formed from the electrode structure of this embodiment, and the first titanium nitride film 14, the titanium film 15, the second titanium nitride film 16 and the third titanium nitride film 21 together form a barrier film.

Figure 7A:
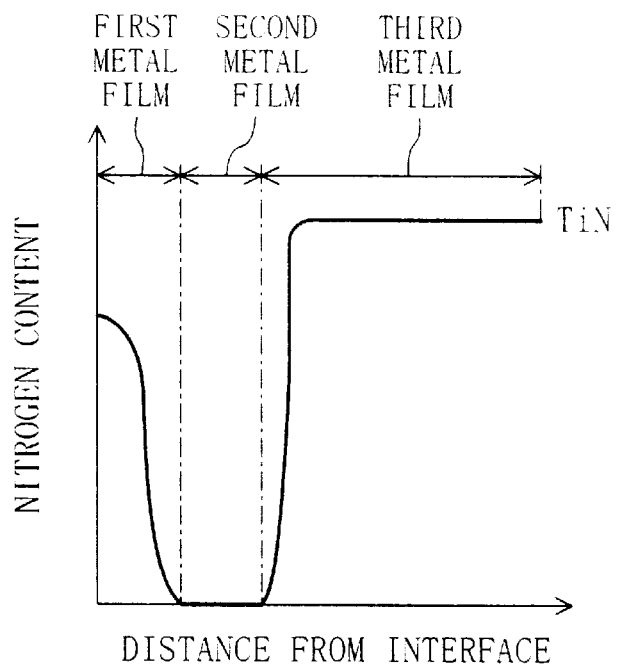
FIGS. 7(a) and 7(b) are diagrams for showing the relationship between a distance from the interface and a nitrogen content in a barrier film formed in Embodiment 2.
Figure 7B:
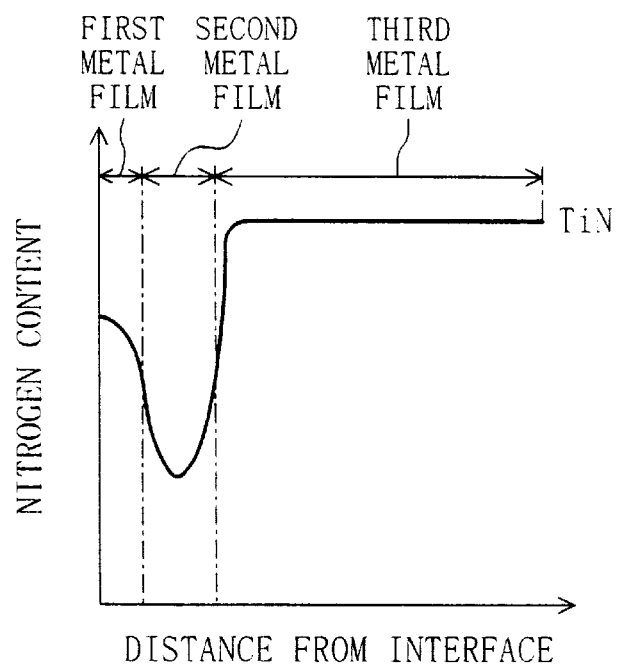

FIGS. 7(a) and 7(b) show distribution of the nitrogen content in the first titanium nitride film 14, the titanium film 15 and the second titanium nitride film 16 included in the barrier film, in which the abscissa indicates a distance from the interface between the barrier film and the polysilicon film toward the substrate. The nitrogen content in the third titanium nitride film 21 is omitted.

In the nitrogen content distribution shown in FIG. 7(a), the nitrogen content is smaller than in TiN on the interface between the first metal film (first titanium nitride film 14) and the polysilicon film, is gradually reduced toward the substrate, and is 0 (zero) on the interface between the first metal film and the second metal film (titanium film 15). Also, the nitrogen content is 0 on the interface between the second metal film and the third metal film (second titanium nitride film 16) and is gradually increased toward the substrate, so that nitrogen can be ultimately present as TiN.

In the nitrogen content distribution shown in FIG. 7(b), the nitrogen content is smaller than in TiN on the interface between the first metal film (first titanium nitride film 14) and the polysilicon film, is gradually reduced toward the substrate and is a half or less of the content in TiN on the interface between the first metal film and the second metal film (titanium film 15). Also, the nitrogen content is approximately a half of that in TiN on the interface between the second metal film and the third metal film (second titanium nitride film 16) and is gradually increased toward the substrate, so that nitrogen can be ultimately present as TiN.

Since the target cleaning process for introducing an argon gas alone into the chamber A is carried out after forming the second titanium nitride film 16 in the surface portion of the titanium film 15 in Embodiment 2, the nitrogen content in the titanium nitride film 13a used for depositing the first titanium nitride film 14 is reduced. Accordingly, as is obvious from comparison between FIGS. 7(a) and 4(a) and between FIGS. 7(b) and 4(b), the nitrogen content in the vicinity of the interface between the first titanium nitride film 14 and the polysilicon film 12 is lower in this embodiment than in Embodiment 1. Accordingly, when the heat treatment is conducted on the electrode structure of this embodiment at 750° C. or more, less nitrogen is diffused from the first titanium nitride film 14 into the polysilicon film 12. As a result, the thickness of the reaction layer 20 (see FIG. 2(c)) formed on the polysilicon film 12 is further reduced or the reaction layer 20 is substantially not formed. Thus, the interface resistance between the polysilicon film 12 and the tungsten film 18 can be further lowered.

Figure 8:
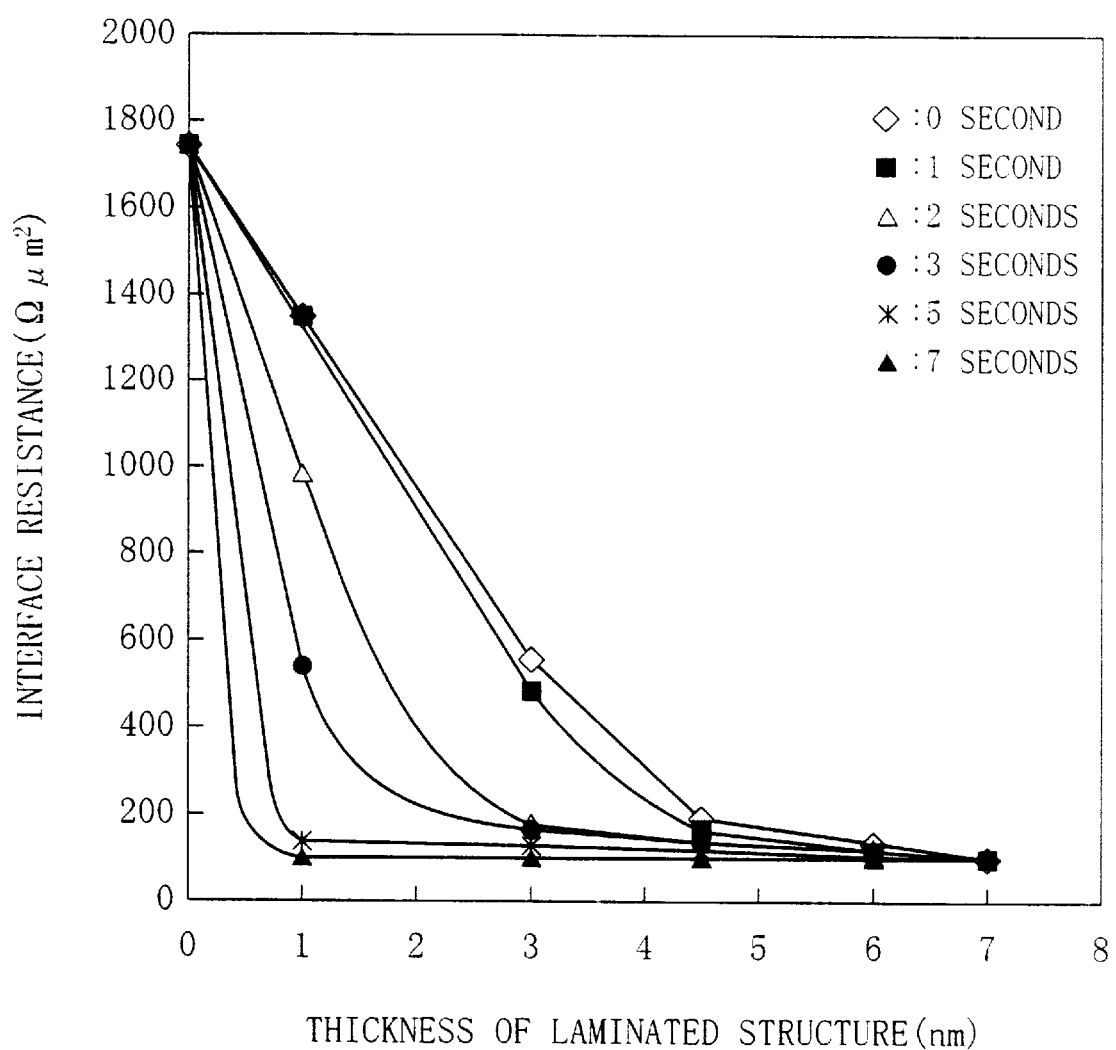
FIG. 8 is a diagram for showing the relationship between the thickness of a laminated structure including a first titanium nitride film and a titanium film and interface resistance between a polysilicon film and a tungsten film in Embodiment 2.

FIG. 8 shows the relationship between the thickness of the laminated structure including the first titanium nitride film 14 and the titanium film 15 and the interface resistance between the polysilicon film 12 and the tungsten film 18 obtained with time of the target cleaning process varied among 0, 1, 2, 3, 5 and 7 seconds. In this case, the polysilicon film 12 is doped to form a p-type gate electrode. The data shown in FIG. 8 are obtained through an experiment where the first titanium nitride film 14 and the titanium film 15 are formed at DC power of 300 W, the second titanium nitride film 16 with a constant thickness of 10 nm is formed by causing discharge at DC power of 2000 W for 20 seconds, and the target cleaning process is carried out at DC power of 1000 W. Also, on the second titanium nitride film 16, the tungsten film 18 with a thickness of 60 nm is formed at DC power of 1000 W. As the heat treatment following the formation of the laminated structure, a furnace treatment is carried out at a temperature of 760° C. for 240 minutes and a lamp annealing treatment is carried out at a temperature of 975° C. for 30 seconds.

As is understood from FIG. 8, as the time of the target cleaning process is longer, the nitrogen content in the first titanium nitride film 14 is reduced, which makes the formation of the reaction layer 20 difficult. As a result, the interface resistance is lowered. This tendency is remarkable when the total thickness of the first titanium nitride film 14 and the titanium film 15 is small. It is noted that a point where the thickness is 0 in FIG. 8 corresponds to the interface resistance obtained by the conventional example (where the barrier film is a single film of titanium nitride).

Figure 9:
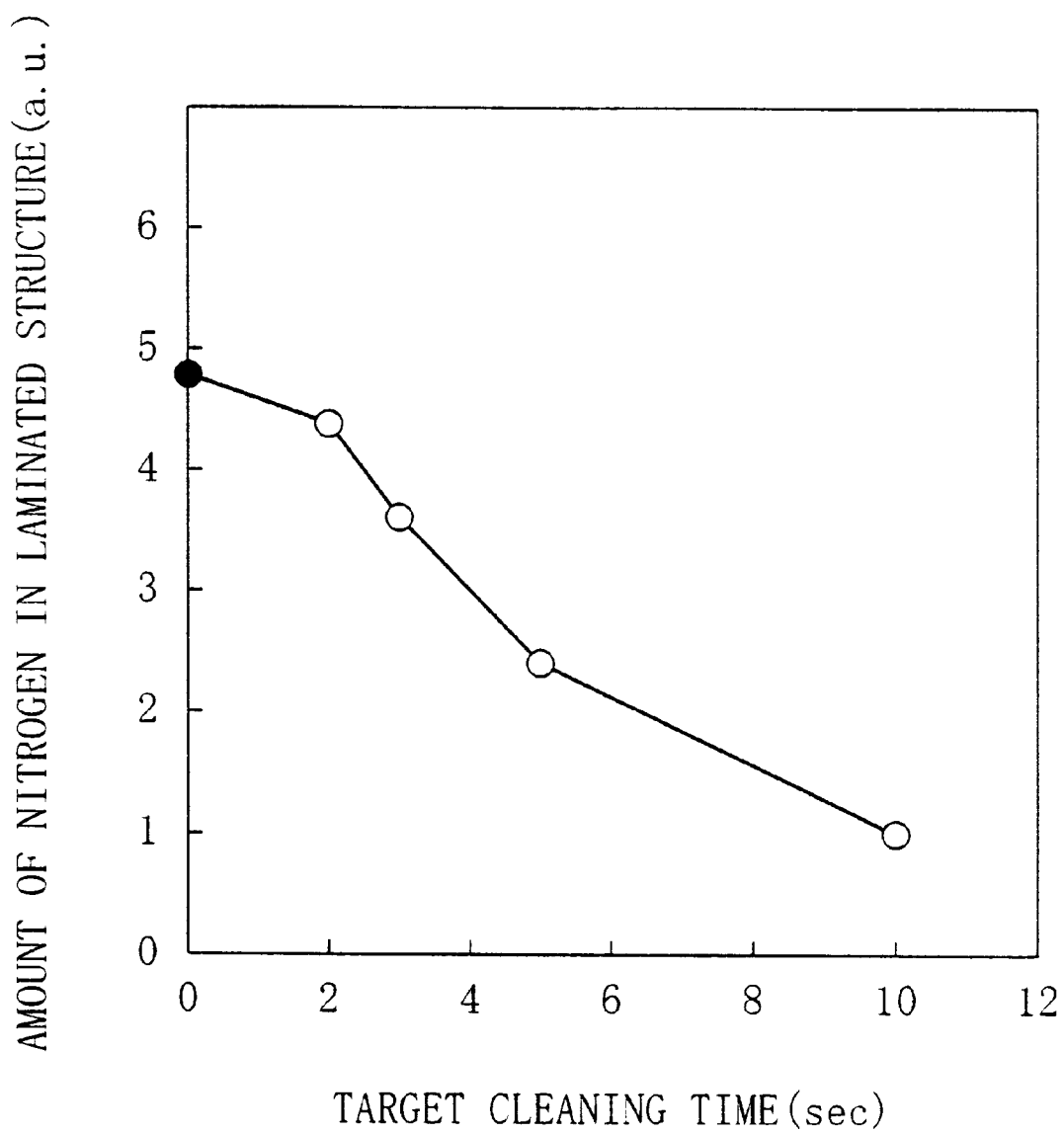
FIG. 9 is a diagram for showing the relationship between time of a target cleaning process conducted in Embodiment 2 and a nitrogen content in the laminated structure including the first titanium nitride film and the titanium film.

FIG. 9 shows the relationship between the time of the target cleaning process and the nitrogen content in the laminated structure including the first titanium nitride film 14 and the titanium film 15. In FIG. 9, the nitrogen content shown with a symbol ● corresponds to that of Embodiment 1 where the target cleaning process is not conducted, and the nitrogen content shown with a symbol ○ corresponds to that of Embodiment 2 where the target cleaning process is conducted. As is understood from FIG. 9, there is a linear relationship between the increase of the time of the target cleaning process and the reduction of the nitrogen content in the laminated structure.

EMBODIMENT 3

A method of fabricating a semiconductor device according to Embodiment 3 of the invention will now be described with reference to FIGS. 10(a), 10(b), 11(a) and 11(b).

Figure 10A:
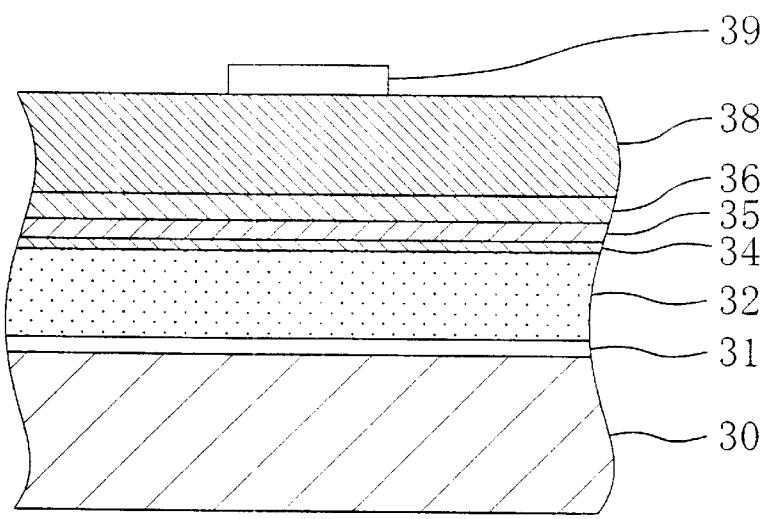
FIGS. 10(a) and 10(b) are cross-sectional views for showing procedures in a method of fabricating a semiconductor device according to Embodiment 3 of the invention.

First, as is shown in FIG. 10(a), a silicon oxide film 31 to be formed into a gate insulating film is formed on a semiconductor substrate 30 and a polysilicon film 32 is deposited on the silicon oxide film 31.

Then, in the same manner as in Embodiment 1, a first titanium nitride film 34, a titanium film 35 and a second titanium nitride film 36 together serving as a barrier film are successively formed on the polysilicon film 32, and a tungsten film 38 is deposited on the second titanium nitride film 36. Thus, a laminated structure including the polysilicon film 32, the first titanium nitride film 34, the titanium film 35, the second titanium nitride film 36 and the tungsten film 38 is formed. Thereafter, a hard mask 39 of a silicon nitride film for forming a gate electrode is formed on the laminated structure.

Figure 10B:
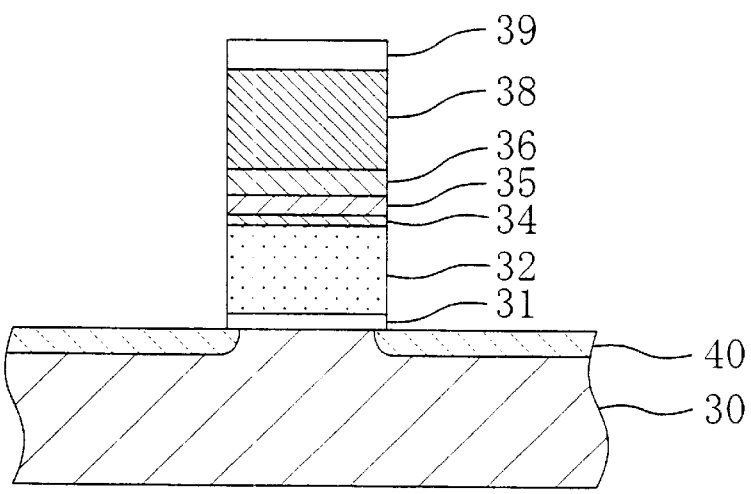

Next, as is shown in FIG. 10(b), the laminated structure is etched by using the hard mask 39, thereby forming a gate electrode from the laminated structure, and the gate electrode is cleaned.

Figure 11A:
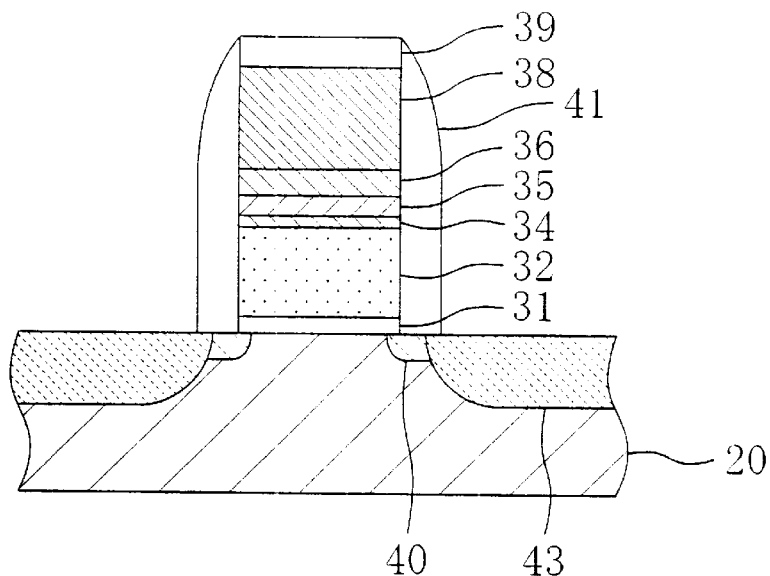
FIGS. 11(a) and 11(b) are cross-sectional views for showing other procedures in the method of fabricating a semiconductor device of Embodiment 3.

Then, the semiconductor substrate 30 is doped with an impurity by using the gate electrode as a mask, thereby forming a low concentration impurity layer 40. A silicon nitride film is then deposited on the entire semiconductor substrate 30, and the silicon nitride film is subjected to anisotropic etching. Thus, a sidewall 41 is formed on the side face of the gate electrode as is shown in FIG. 11(a). Thereafter, the semiconductor substrate 30 is doped with an impurity by using the gate electrode and the sidewall 41 as a mask, thereby forming a high concentration impurity layer 43.

Figure 11B:
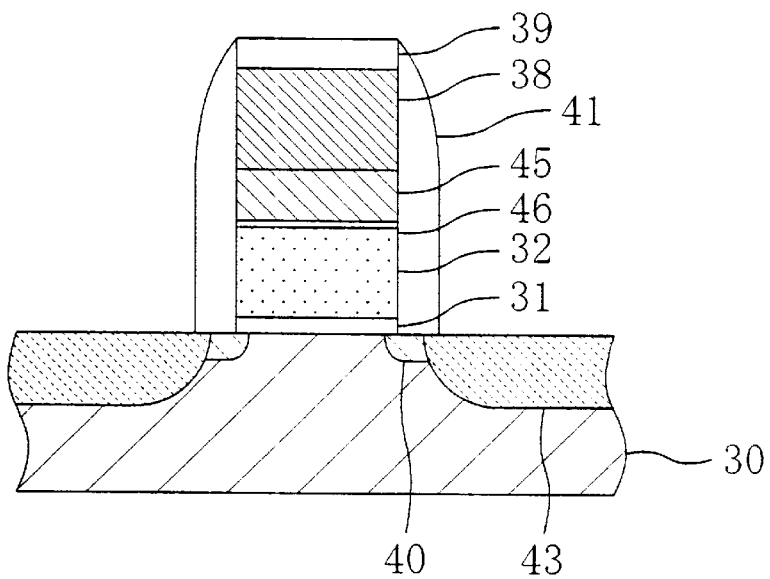
Figure 12A:
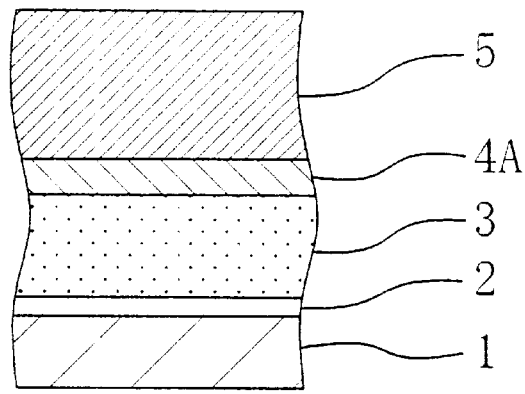
FIG. 12(a) is a cross-sectional view of an electrode structure of a first conventional example.
Figure 12B:
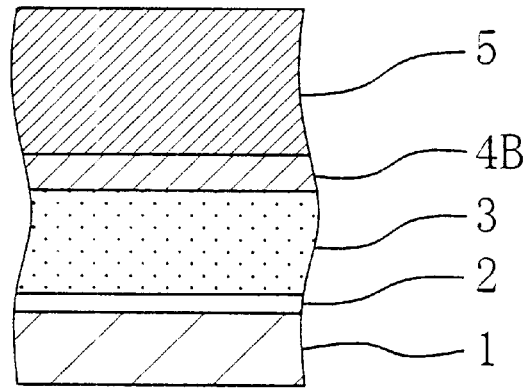
FIG. 12(b) is a cross-sectional view of an electrode structure of a second conventional example and FIG. 12(c) is a cross-sectional view of the electrode structure of the first conventional example after conducting a heat treatment at 750° C. or more.
Figure 12C:
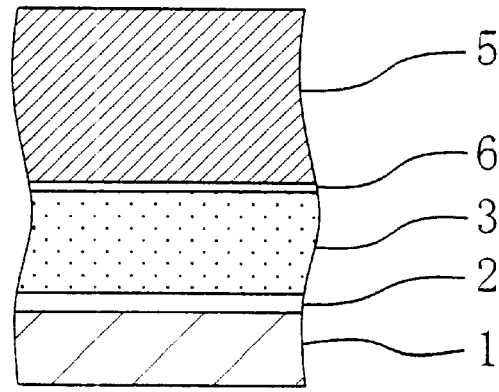
Figure 13A:
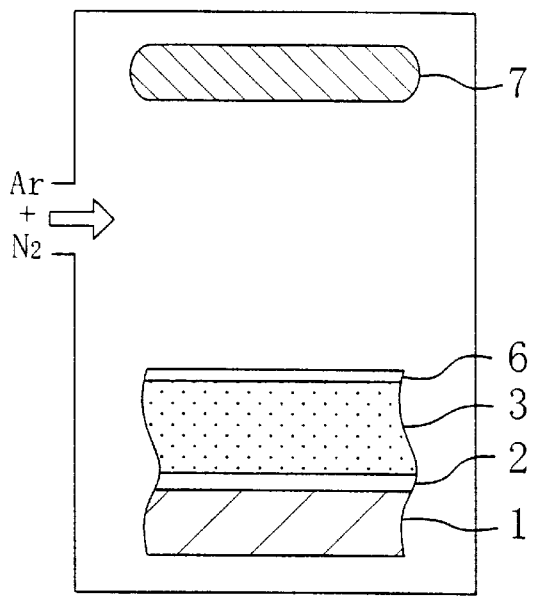
FIGS. 13(a), 13(b) and 13(c) are cross-sectional views for showing procedures in a method of forming the electrode structure of the second conventional example.
Figure 13B:
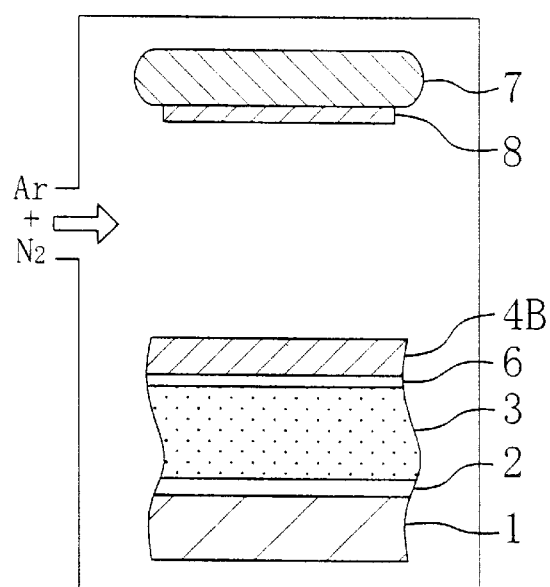
Figure 13C:
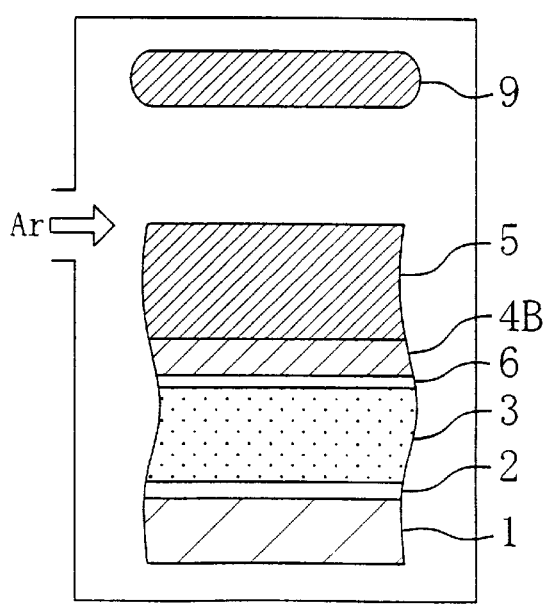
Figure 14A:
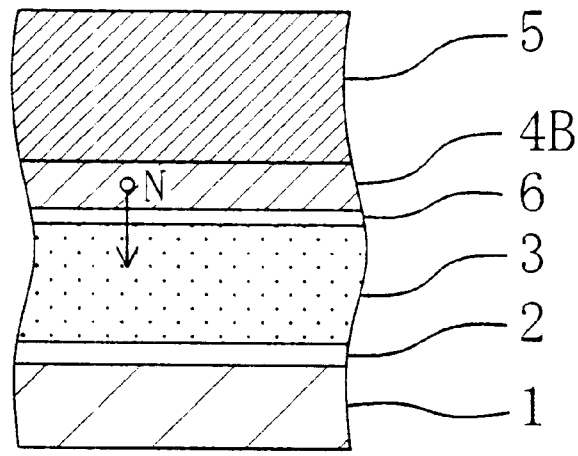
FIGS. 14(a) and 14(b) are cross-sectional views for illustrating a problem of the method of forming the electrode structure of the second conventional example.
Figure 14B:
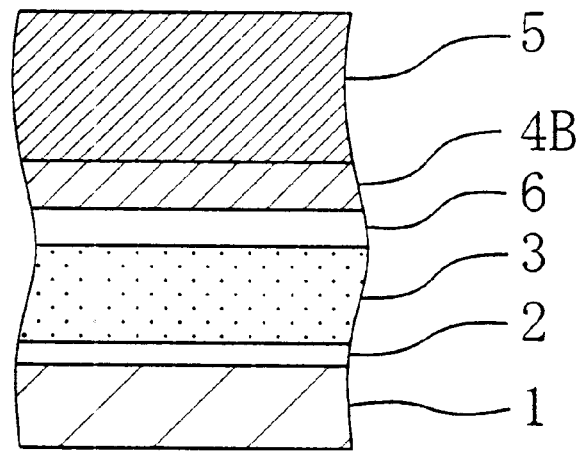
Figure 15:
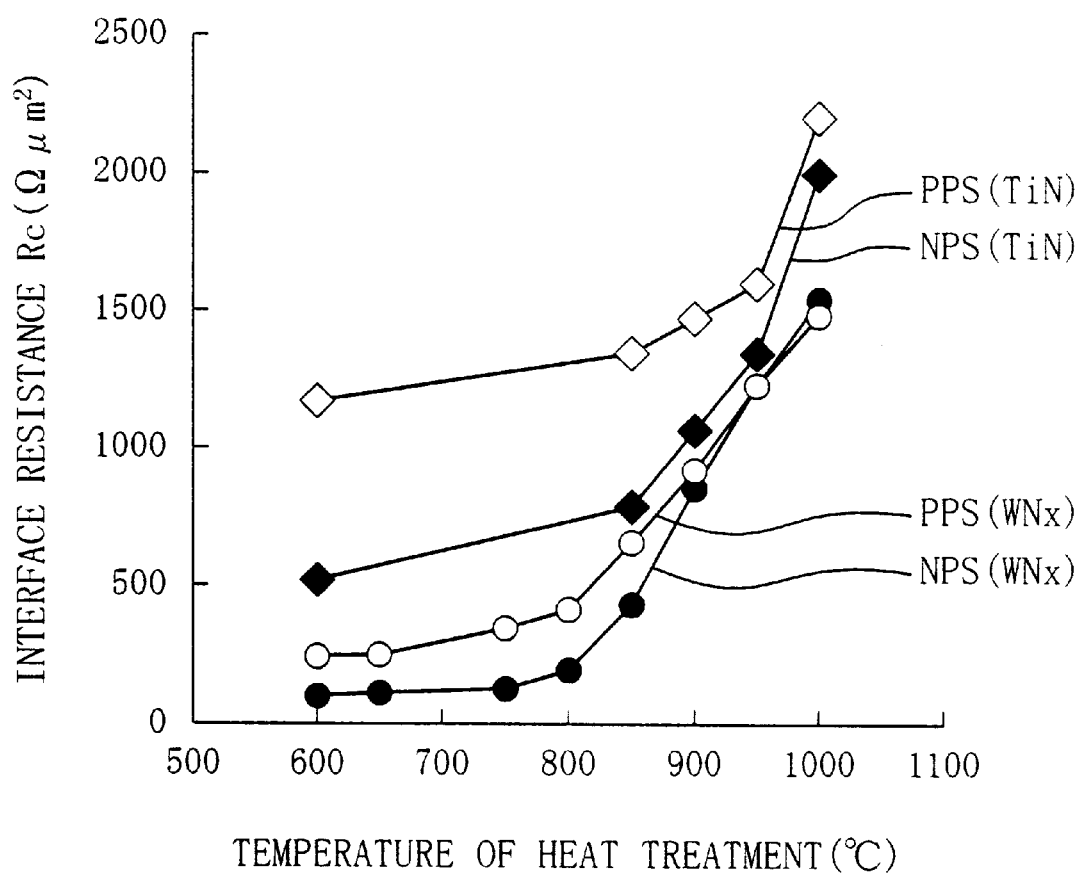
FIG. 15 is a diagram for showing the relationship between a temperature of a heat treatment and interface resistance after the heat treatment conducted on gate electrodes formed by the methods of forming the electrode structures of the first and second conventional examples.

Next, the semiconductor substrate 30 is subjected to a heat treatment at a temperature of 750° C. or more, thereby activating the low concentration impurity layer 40 and the high concentration impurity layer 43. In this manner, nitrogen present in the first titanium nitride film 34 and the second titanium nitride film 36 is diffused into the titanium film 35. As a result, as is shown in FIG. 11(b), a new titanium nitride film 45 is formed between the polysilicon film 32 and the tungsten film 38, and a reaction layer 56 including silicon and nitrogen as main components is formed on the interface between the polysilicon film 32 and the titanium nitride film 45.

Since formation of a titanium silicide layer can be avoided and the interface resistance can be low even after the heat treatment at 750° C. or more in Embodiment 3, the degradation in the operation speed of the MOS transistor can be prevented. Furthermore, peeling of the tungsten film 38 derived from the formation of a titanium silicide layer can be avoided.

Although a tungsten film is used as a high-melting-point metal film in each of Embodiments 1 through 3, a molybdenum (Mo) film, a tungsten silicide (WSi$_x$) film or a molybdenum silicide (MoSi$_2$) film can be used instead.

Although titanium is used as a metal for forming the barrier film in each embodiment, tantalum (Ta), tungsten (W) or the like can be used instead.

Furthermore, the silicon substrate used in each of Embodiments 1 through 3 can be replaced with a SOI substrate.

What is claimed is:

1. A method of forming an electrode structure comprising the steps of:
    forming a barrier film on a silicon-containing film including silicon as a main component;
    depositing a high-melting-point metal film on said barrier film, whereby forming a laminated structure including said silicon-containing film, said barrier film and said high-melting-point metal film; and
    conducting a heat treatment on said laminated structure at a temperature of 750° C. or more,
    wherein the step of forming said barrier film includes sub-steps of:
        forming a first metal film of a nitride of a metal on said silicon-containing film;
        forming, on said first metal film, a second metal film of said metal or the nitride of said metal with a smaller nitrogen content than said first metal film; and
        forming, on said second metal film, a third metal film of the nitride of said metal with a larger nitrogen content than said second metal film, and
    wherein during said heat treatment, excessive nitrogen included in said first metal film and said third metal film diffuses into said second metal film and nitrides said metal of said second metal film, thereby a new metal film of the nitride of said metal is formed.

2. The method of forming an electrode structure of claim 1,
    wherein said metal is titanium.

3. A method of forming an electrode structure comprising the steps of:
    forming a barrier film on a silicon-containing film including silicon as a main component;
    depositing a high-melting-point metal film on said barrier film, whereby forming a laminated structure including said silicon-containing film, said barrier film and said high-melting-point metal film; and
    conducting a heat treatment on said laminated structure at a temperature of 750° C. or more,
    wherein the step of forming said barrier film includes sub-steps of:
        forming a first metal film of a nitride of a metal on said silicon-containing film;
        forming, on said first metal film, a second metal film of said metal or the nitride of said metal with a smaller nitrogen content than said first metal film; and
        forming, on said second metal film, a third metal film of the nitride of said metal with a larger nitrogen content than said second metal film;
    wherein the step of forming said barrier film includes sub-steps of:
        forming said first metal film by depositing the nitride of said metal on said silicon-containing film through sputtering using an inert gas substantially including no nitrogen gas conducted on a nitride film of said metal formed in a surface portion of a target including said metal as a main component, and forming said second metal film by depositing said metal on said first metal film; and
        conducting sputtering using a mixed gas including a nitrogen gas and an inert gas on said target, whereby said third metal film is formed by depositing, on said second metal film, the nitride of said metal obtained through a reaction of said metal and nitrogen included in said mixed gas.

4. The method of forming an electrode structure of claim 3, further comprising, after the step of forming said barrier film, a step of conducting sputtering using an inert gas substantially including no nitrogen gas on said nitride film of said metal formed in the surface portion of said target formed in the sub-step of forming said third metal film.

5. A method of forming an electrode structure comprising the steps of:
    forming a barrier film on a silicon-containing film including silicon as a main component;
    depositing a high-melting-point metal film on said barrier film, whereby forming a laminated structure including said silicon-containing film, said barrier film and said high-melting-point metal film; and
    conducting a heat treatment on said laminated structure at a temperature of 750° C. or more,
    wherein the step of forming said barrier film includes sub-steps of:
        forming a first metal film of a nitride of a metal on said silicon-containing film;
        forming, on said first metal film, a second metal film of said metal or the nitride of said metal with a smaller nitrogen content than said first metal film; and
        forming, on said second metal film, a third metal film of the nitride of said metal with a larger nitrogen content than said second metal film;
    wherein the step of forming said barrier film includes sub-steps of:
        introducing an inert gas substantially including no nitrogen gas into a chamber where a target including said metal as a main component and having a nitride film of said metal in a surface portion thereof is placed and causing discharge within said chamber, whereby said first metal film is formed by depositing, on said silicon-containing film, the nitride of said metal sputtered out from said nitride film of said metal, and forming said second metal film by depositing said metal on said first metal film; and introducing a mixed gas including a nitrogen gas and an inert gas into said chamber where said target is placed and causing discharge within said chamber, whereby said third metal film is formed by depositing, on said second metal film, the nitride of said metal obtained through a reaction between said metal and nitrogen included in said mixed gas.

6. The method of forming an electrode structure of claim 5, further comprising, after the step of forming said barrier film, a step of introducing an inert gas substantially including no nitrogen gas into said chamber and causing discharge within said chamber.

7. A method of fabricating a semiconductor device comprising the steps of:
   forming a silicon-containing film including silicon as a main component on a semiconductor region;
   forming a barrier film on said silicon-containing film;
   depositing a high-melting-point metal film on said barrier film, whereby forming a gate electrode including said silicon-containing film, said barrier film and said high-melting-point film;
   forming an impurity layer serving as a source and drain through ion implementation of an impurity into said semiconductor region with said gate electrode used as a mask; and
   activating said impurity layer by conducting a heat treatment at a temperature of 750° C. or more,
   wherein the step of forming said barrier film includes sub-steps of:
      forming a first metal film of a nitride of a metal on said silicon-containing film;
      forming, on said first metal film, a second metal film of said metal or the nitride of said metal with a smaller nitrogen content than said first metal film; and
      forming, on said second metal film, a third metal film on the nitride of said metal with a larger nitrogen content than said second metal film, and
   wherein during said heat treatment, excessive nitrogen included in said first metal film and said third metal film diffuses into said second metal film and nitrides said metal of said second metal film, thereby a new metal film of the nitride of said metal is formed.

8. The method of fabricating a semiconductor device of claim 7,
   wherein said metal is titanium.

* * * * *

UNITED STATES PATENT AND TRADEMARK OFFICE
CERTIFICATE OF CORRECTION

PATENT NO. : 6,451,690 B1  Page 1 of 1
DATED : September 17, 2002
INVENTOR(S) : Michikazu Matsumoto et al.

It is certified that error appears in the above-identified patent and that said Letters Patent is hereby corrected as shown below:

<u>Title page,</u>
Item [73], Assignee, delete "Matsushita Electronics Corporation" add -- Matsushita Electric Industrial Co., Ltd. --.

Signed and Sealed this

Eleventh Day of March, 2003

JAMES E. ROGAN
*Director of the United States Patent and Trademark Office*